US012463024B2

(12) United States Patent
Korzec et al.

(10) Patent No.: US 12,463,024 B2
(45) Date of Patent: Nov. 4, 2025

(54) DEVICE FOR GENERATING A DIELECTRIC BARRIER DISCHARGE AND METHOD FOR TREATING AN OBJECT TO BE ACTIVATED

(71) Applicant: TDK Electronics AG, Munich (DE)

(72) Inventors: Dariusz Korzec, Falkenstein (DE); Stefan Nettesheim, Regensburg (DE); Florian Freund, Bad Abbach (DE)

(73) Assignee: TDK ELECTRONICS AG, Munich (DE)

( * ) Notice: Subject to any disclaimer, the term of this patent is extended or adjusted under 35 U.S.C. 154(b) by 420 days.

(21) Appl. No.: 17/758,546

(22) PCT Filed: Dec. 17, 2020

(86) PCT No.: PCT/EP2020/086796
§ 371 (c)(1),
(2) Date: Jul. 8, 2022

(87) PCT Pub. No.: WO2021/144111
PCT Pub. Date: Jul. 22, 2021

(65) Prior Publication Data

US 2023/0046192 A1 Feb. 16, 2023

(30) Foreign Application Priority Data

Jan. 15, 2020 (DE) ......................... 102020100828.7

(51) Int. Cl.
*H01J 37/32* (2006.01)
*H10N 30/40* (2023.01)

(52) U.S. Cl.
CPC .. *H01J 37/32825* (2013.01); *H01J 37/32348* (2013.01); *H01J 37/32458* (2013.01);
(Continued)

(58) Field of Classification Search
CPC ........... H01J 37/32825; H01J 37/32348; H01J 37/32458; H01J 37/32743;
(Continued)

(56) References Cited

U.S. PATENT DOCUMENTS 6,007,770 A * 12/1999 Peiper .................. A61L 2/0011 422/23
10,029,025 B2 7/2018 Nettesheim
(Continued)

FOREIGN PATENT DOCUMENTS

DE 1640574 U 7/1952
DE 10320805 A1 12/2004
(Continued)

OTHER PUBLICATIONS

Rathmann, D.; "Kunststoffgalvanisierung"; Chemie in unserer Zeit, 15 Jahrg. 1981, No. 6; 0009-2851/81/0612-0201; English translation not available (1 page).
(Continued)

*Primary Examiner* — Charlee J. C. Bennett
(74) *Attorney, Agent, or Firm* — NIXON PEABODY LLP

(57) ABSTRACT

The present invention relates to a device for generating a dielectric barrier discharge for treatment of an object to be activated with non-thermal atmospheric pressure plasma, comprising a dielectric working chamber which has a wall of a dielectric material and which encloses a working space, wherein a metallization is applied to an outer side of the wall facing away from the working space, wherein the working space is an open volume, and a high-voltage source which is configured to apply a high voltage to the metallization or to the object to be activated when the object to be activated is in the working space. According to a further aspect, the invention relates to a method of treatment of an object to be activated with a non-thermal atmospheric pressure plasma.

24 Claims, 4 Drawing Sheets

(52) U.S. Cl.
CPC .. *H01J 37/32743* (2013.01); *H01J 37/32807* (2013.01); *H01J 2237/162* (2013.01); *H01J 2237/336* (2013.01); *H10N 30/40* (2023.02)

(58) Field of Classification Search
CPC ........... H01J 37/32807; H01J 2237/162; H01J 2237/336; H01J 2237/332–3348; H10N 30/40
USPC ....... 118/723 R, 715–733; 156/345.1–345.55
See application file for complete search history.

(56) References Cited

U.S. PATENT DOCUMENTS

| | | | | |
|---|---|---|---|---|
| 10,426,588 | B2 | 10/2019 | Lam | |
| 2009/0009090 | A1 | 1/2009 | Viol et al. | |
| 2010/0179665 | A1 | 7/2010 | Schlottig | |
| 2014/0216658 | A1 * | 8/2014 | Minami ............ | H01L 21/67184 156/345.31 |
| 2015/0361558 | A1 * | 12/2015 | Foote ....................... | B05D 1/62 427/563 |
| 2016/0129142 | A1 * | 5/2016 | Nettesheim ............... | A61L 2/14 315/111.21 |
| 2016/0302906 | A1 * | 10/2016 | Lam .......................... | A61F 2/12 |
| 2018/0138022 | A1 * | 5/2018 | Lam ..................... | H05H 1/2465 |
| 2018/0295708 | A1 | 10/2018 | Trutwig | |
| 2019/0308027 | A1 | 10/2019 | Hahnl | |
| 2020/0187343 | A1 | 6/2020 | Weilguni | |
| 2020/0221564 | A1 | 7/2020 | Wandke | |
| 2020/0305266 | A1 * | 9/2020 | Nettesheim .......... | H05H 1/2475 |

FOREIGN PATENT DOCUMENTS

| | | | | |
|---|---|---|---|---|
| DE | 102006011312 | A1 | 10/2007 | |
| DE | 202008008733 | U1 | 11/2009 | |
| DE | 202008008734 | U1 | 11/2009 | |
| DE | 102013107448 | A1 | 1/2015 | |
| DE | 102014213967 | A1 | 1/2016 | |
| DE | 102015117715 | A1 | 4/2017 | |
| DE | 102017116800 | A1 | 1/2019 | |
| DE | 102016104490 | B3 | 7/2021 | |
| EP | 1150620 | B1 | 11/2003 | |
| EP | 2223704 | A1 | 9/2010 | |
| EP | 2292178 | A1 | 3/2011 | |
| EP | 2476443 | B1 | 9/2018 | |
| EP | 3452168 | B1 | 8/2020 | |
| JP | 2007265932 | A | 10/2007 | |
| JP | 2018519873 | A | 7/2018 | |
| JP | 2018160352 | A | 10/2018 | |
| JP | 2019507943 | A | 3/2019 | |
| KR | 20210032660 | A * | 3/2021 | ............ A61L 27/02 |
| WO | WO 97/09071 | A1 | 3/1997 | |
| WO | WO 2008/002478 | A2 | 1/2008 | |
| WO | 2009078361 | A1 | 6/2009 | |
| WO | WO 2010008076 | A1 | 1/2010 | |
| WO | WO 2015/087326 | A1 | 6/2015 | |
| WO | WO 2016186501 | A2 | 11/2016 | |
| WO | WO 2019/035135 | A1 | 2/2019 | |

OTHER PUBLICATIONS

Dinu, G.; "Dielektrisch behinderte Barrierenentladungen fur grofsflächige Plasmabehandlungen" dissertation; Wuppertal, Jul. 15, 2005; English translation not available (3 pages).

Opposition filed in German Patent Application No. 10 2020 100 828.7, dated Dec. 6, 2023, in German (35 pages).

International Search Report and Written Opinion of International Searching Authority corresponding to International Patent Application No. PCT/EP2020/086796, mailed Apr. 20, 2021, with English translation of Search Report (11 pages).

Adam, M.; "Nanostrukturierte Beschichtung auf Implantaten zur Erhöhung der Osseointegration" dissertation; Universität Rostock; Jun. 2013; urn:nbn:de:gbv:28-diss2014-0108-7; English translation not available (125 pages).

Chaichi, A. et al.; "Improvement of Tribological and Biocompatibility Properties of Orthopedic Materials Using Piezoelectric Direct Discharge Plasma Surface Modification"; ACS Biomater. Sci. Eng. Apr. 15, 2019, vol. 5, pp. 2147-2159; DOI: 10.1021/acsbiomaterials.9b00009 (13 pages).

DOT Medical Implant Solutions; "Beschichtungen-Oberflaechenbehandlungen-Dental"; English translation not available; undated (1 page).

Daiga Ujino et al.; "Effect of Plasma Treatment of Titanium Surface on Biocompatibility"; Appl. Sci., vol. 9, 2257; May 31, 2019; DOI: 10.3390/app9112257 (12 pages).

"Hydrophile Implantatoberfläche von Dentalimplantaten BioniQ"; English language version not available; LASAK s.r.o.; Prague, Czech Republic; copyright 2022; retrieved from https://de.lasak.cz/dentalerfachbereich/produkte/implantologie-3/bioniqzahnimplantate/hydrophile-bio-oberflache on Jun. 22, 2022 (3 pages).

"IP—Hydrophilisierung Dental-Implantate Projekt Nr. 759" PowerPoint presentation; relyon plasma GmbH; retrieved on Jun. 22, 2022; English language version not available (17 pages).

"Implantatgetragene Rehabilitation post radiationem mit Straumann SLA- und SLActive-Implantaten: Follow-up nach 5 Jahren"; Jun. 2018; English language version not available; retrieved from https://www.straumann.com/content/dam/mediacenter/straumann/dech/documents/brochure/productinformation/ch_151.917_de_straumann_slactive.pdf (1 page).

Sweden & Martina S.p.A .; "Chair Side Plasma Cleaning: Plasma R"; Due Carrare, Italy; rev. Jul. 2013 (20 pages).

Liu, X et al.; "Surface modification of titanium, titanium alloys, and related materials for biomedical applications"; Materials Science and Engineering Reports, vol. 47, pp. 49-121; Jan. 13, 2005; DOI: 10.1016/j.mser.2004.11.001 (73 pages).

Thommen Medical; "Hydrophile Implantatoberflächen—schnellere und sichere Integration"; Thommen Medical; Dent. Implantol., vol. 19, No. 7, pp. 528-529; English language version not available; retrieved from https://www.thommenmedical.com/fileadmin/Media/05_Downloadcenter/Medien/DE/Pressespiegel/3_di_15_7_thommen.pdf (2 pages).

Examination Report in related Japanese Patent Application No. 2022-543071, dated Oct. 1, 2024, in Japanese (5 pages).

Examination Report in related Japanese Patent Application No. 2022-543071, in Japanese, dated Jan. 22, 2025 (4 pages).

Examination Report in related Japanese Patent Application No. 2022-543071, in Japanese, dated Jul. 7, 2025 (3 pages).

Examination Report in related Chinese Patent Application No. 202080093251.2, in Chinese, dated Jul. 19, 2025 (11 pages).

Examination Report in related German Patent Application No. 10 2020 100 828.7, in German, dated Jul. 14, 2025 (8 pages).

Diagram retrieved from <https://www.meteo.physik.uni-muenchen.de/mesomikro/stadt/messung.php?> on Jul. 29, 2025; published Jul. 29, 2025 (1 page).

Brenner, K.F.; "Atmosphärendruckplasma"; retrieved from <https://de.wikipedia.org/w/index.php?title=Atmosph%C3%A4rendruckplasma&diff=prev&oldid=194945380> on Jul. 29, 2025; in German with English machine translation; published Dec. 4, 2019 (8 pages).

"Koronaentladung" —Versionsunterschied; retrieved from <https://de.wikipedia.org/w/index.php? title=Koronaentladung&diff=prev&ol-did=193086907> on Jul. 29, 2025; in German; published Oct. 2019 (3 pages).

"Niederdruckplasma" —Versionsunterschied; retrieved from <https://de.wikipedia.org/w/index.php? title=Niederdruckplasma&diff=prev&ol-did=194904350> on Jul. 29, 2025; in German; published Dec. 2019 (3 pages).

* cited by examiner

DEVICE FOR GENERATING A DIELECTRIC BARRIER DISCHARGE AND METHOD FOR TREATING AN OBJECT TO BE ACTIVATED

RELATED APPLICATIONS

This application is a U.S. National Stage of International Application No. PCT/EP2020/086796 filed on Dec. 17, 2020, which claims the benefit of German Patent Application No. 102020100828.7, filed on Jan. 15, 2020, each of which is hereby incorporated by reference in its entirety.

FIELD OF THE INVENTION

The present invention relates to a device for generating a dielectric barrier discharge for treatment of an object to be activated with non-thermal atmospheric pressure plasma and a method for the treatment of an object to be activated with non-thermal atmospheric pressure plasma.

BACKGROUND OF THE INVENTION

The object to be activated may be, for example, an implant intended to be placed in a human or animal body. However, it may also be another object where hydrophilisation of the surface is desired.

It is known that in the case of implants, for example in the dental field, a healing time is significantly reduced if the implant is hydrophilic. In addition, hydrophilic implants have a significantly increased stability during the healing process and a better ingrowth behaviour (osseointegration) compared to hydrophobic implants. Implants are usually made of materials that have hydrophilic surfaces, for example titanium, e.g. grade 4, or zirconium oxide. However, organic impurities can make the surface of the implant hydrophobic. These organic impurities can arise, for example, during the manufacture or storage of the implants. The hydrophilisation of the surface is intended to replace the hydrocarbon groups that are formed on the surface by the organic contamination with hydrophilic OH groups. Since such hydrophilisation is not permanently stable in air, it should be carried out shortly before inserting the implant. It is advantageous if the hydrophilisation can be carried out within a short time in order to change the workflow as little as possible when inserting the implant.

From WO 2015/087326 A1 a process for hydrophilisation of implants is known, in which a plasma is ignited in a completely sealed container or package in which an implant is delivered. After the plasma process, the container is opened and the implant is transplanted into a biological environment. It takes a great deal of effort for implant manufacturers to develop, get approved and manufacture a package or container that is sterile, leak-proof and compatible with the plasma generator. Only implants from manufacturers using this packaging are compatible with the device. Thus, the device cannot be used for any implant.

SUMMARY OF THE INVENTION

It is now an object of the present invention to provide an improved device for the plasma treatment of objects to be activated, which, for example, does not require any specific packaging of the object to be activated. A further task is to provide an improved method for plasma treatment.

These tasks are solved by a device according to claim 1 and a method according to the second independent claim.

A device for generating a dielectric barrier discharge for the treatment of an object to be activated with non-thermal atmospheric pressure plasma is proposed. The device comprises a dielectric working chamber and a high voltage source. The dielectric working chamber has a wall made of a dielectric material which encloses a working space, a metallization being applied to an outer side of the wall facing away from the working space. The working space is an open volume. The high-voltage source is configured to apply a high voltage to the metallization or to the object to be activated.

An "open volume" can be defined here as a non-encapsulated volume or a non-closed volume. An open volume may be characterised by gases, e.g. air, being able to exit the volume and gases, e.g. air, being able to enter the volume from the environment. An open volume may be defined as a volume that is not hermetically sealed by a package or container.

The device can perform plasma treatment on any object that is sized to be inserted into the working chamber. The device is not limited to specific implants arranged in a specific package, for example. This makes the device universally applicable. Since the working space is an open volume and plasma ignition can be generated between the metallization and the object to be activated itself, there are no special requirements for encapsulation of the object to be activated. On the contrary, such encapsulation can be dispensed with.

The working space of the dielectric working chamber is not a closed volume. Rather, the working space may have an entrance and an exit so that a flow of air can pass through the working space. Alternatively, the working space may have only one entrance.

The metallization may be a metal layer applied to the wall in a material-bonding manner. Alternatively, the metallization may be separated from the wall by a gap with a small gap dimension. For this purpose, the metallization may be applied to the wall by means of a plug-in connection, for example.

The wall of dielectric material separates the metallization and the object to be activated, whereby the high voltage source is configured to apply a high voltage between the metallization and the object. In doing so, the wall can act as a dielectric barrier and thus ensure that plasma is ignited by a dielectric barrier discharge between the metallization and the object to be activated. The metallization can act as an electrode. In a dielectric barrier discharge, the plasma is to a large extent ignited directly at the dielectric barriers. In addition to the inner side of the wall, a surface of the object to be activated can also act as a dielectric barrier. Thus, plasma can be ignited directly on the surface of the object to be activated. Accordingly, the plasma can activate and hydrophilise the surface of the object with a high degree of efficiency.

For the hydrophilisation of an object, plasma ignition by means of a dielectric barrier discharge offers several advantages. In the dielectric barrier discharge, a large part of the plasma is ignited directly on the dielectric barriers. Accordingly, much of the plasma is ignited on the surface of the object, thereby activating this surface. In the case of dielectric barrier discharges, the plasma ignition takes place in micro-discharges distributed over a large area, so that the object can be activated evenly over its entire surface. In dielectric barrier discharges, oxygen species are generated that contribute to the hydrophilisation of the surface of the object. In dielectric barrier discharges, local energy densities are not too high, so that damage to the object to be activated can be avoided.

The treatment of the object to be activated can take place at ambient pressure. Ambient pressure can be present in the working chamber. Accordingly, the pumping out of a low-pressure chamber can be dispensed with. Accordingly, the devices used are more compact, more mobile and less expensive than devices based on a device with a low-pressure chamber. In addition, the process can be carried out significantly faster, as the step of pumping out the low-pressure chamber, which usually takes several minutes, can be dispensed with. Moreover, since the plasma can burn directly on the object to be activated, the plasma treatment step can also be much shorter.

Overall, the device thus makes it possible to carry out a rapid treatment of the object to be activated. This makes it possible to integrate the plasma treatment for hydrophilisation into workflows. Intermediate storage of the object to be activated can be avoided.

The device can also have a receptacle that is configured to pick up the object to be activated and move it into the working space.

The device can be designed in such a way that the object to be activated only comes into direct mechanical contact with the receptacle. Contamination of the object by the wall of the dielectric working chamber or by the high-voltage source can thus be excluded.

The receptacle can be a mechanical element configured to grip and hold the object to be activated. The receptacle can be configured to move the object to be activated along a defined path. The receptacle may additionally be configured to apply an electrical potential to the object to be activated.

The receptacle can be configured to move the object to be activated in the working space in a rotational movement and/or in a translational movement. The receptacle can either be moved manually or by a mechanical drive, for example a motor. The rotational and translational movement of the object to be activated within the working space can ensure that the object to be activated is uniformly treated with plasma.

The object to be activated may be an implant that is treated with non-thermal atmospheric pressure plasma prior to a medical treatment. For example, it may be a dental implant. By treating the implant with non-thermal atmospheric pressure plasma, the wettability of the implant with water or blood can be increased, which improves the ingrowth behaviour of the implant. The plasma treatment of the implant is carried out before the medical treatment. The device enables the plasma treatment of the implant to be carried out in a short period of time, so that the plasma treatment can be carried out immediately before the start of the medical treatment and intermediate storage can be dispensed with.

The high voltage source can be configured to generate a dielectric barrier discharge between the object to be activated and the metallization.

The working space is preferably at atmospheric pressure. In alternative embodiments, the pressure in the working space may be less than 1 Atm. An atmospheric pressure in the working space offers the advantage that the step of pumping out the working space can be omitted and thus the process can be carried out faster.

The device is configured to hydrophilise a surface of the object to be activated by treatment with non-thermal atmospheric pressure plasma.

The device may comprise a base unit having an opening for the receptacle of the dielectric working chamber. In this regard, all elements of the device that are reusable, i.e. that can be used for multiple plasma treatments of different objects, may be arranged in the base unit. In particular, the high voltage source may be arranged in the base unit. The base unit may have a closed housing in which the opening for receptacle of the dielectric working chamber is formed.

The dielectric working chamber may be configured to be inserted into the opening of the base unit prior to the plasma treatment and to be removed from the opening of the base unit after the plasma treatment has been performed. Accordingly, the dielectric working chamber is a disposable product used for a single plasma treatment only. An appropriately configured dielectric working chamber may be selected for each plasma treatment. For example, the device may have a set of different dielectric working chambers that allow different plasma treatments.

The wall of the dielectric working chamber may comprise a part located at an entrance of the dielectric working chamber, where the wall has a higher thickness than in another part. This part may form a collar. The entrance of the dielectric working chamber may be an opening of the dielectric working chamber through which the object to be activated can be introduced into the working space.

The part of increased thickness can serve several purposes. It can form a support of the dielectric working chamber on the base unit and thereby enable a defined positioning of the dielectric working chamber on the base unit. The portion of increased thickness may also form a support surface for the receptacle, thereby allowing the receptacle and the object to be activated, which is held by the receptacle, to be positioned at a defined position relative to the dielectric working chamber. The part of increased thickness may also provide insulation between the metallization and the receptacle.

The metallization may be a continuous sleeve-shaped metallization or may comprise a plurality of annular sections separated from each other. Sleeve-shaped metallization can provide uniform plasma treatment of a large implant, further reducing treatment time. Annular metallizations have the advantage that their capacitance and thus the parasitic load between the electrode and the implant are reduced. In addition, the field strength at the edges of the ring-shaped metallization is particularly high. A further alternative is a single ring-shaped segment whose extension is smaller than the dimension of the object to be treated. In this case, the object to be treated can be moved relative to the ring-shaped segment in such a way that it is ensured that all surfaces of the object to be treated are sufficiently treated with plasma.

The high voltage source may comprise a piezoelectric transformer. In this case, a high voltage can either be tapped from an output side of the piezoelectric transformer via a mechanical contact and applied to the electrode or the object to be activated, or can be transferred from the output side of the piezoelectric transformer to the electrode or the object to be activated by means of a contactless spark gap. Piezoelectric transformers have, among other things, the advantage that they can be operated with a low input voltage, even with a battery, and can accordingly be designed as mobile devices.

The device may comprise a fan and/or a filter element. The fan and filters may be arranged in the base unit. The fan may be arranged to generate an airflow through the working space, wherein the object to be activated is cooled by the airflow. The filter may be an ozone filter that can prevent excessive ozone concentration outside the base unit.

The working space may be filled with air. The device may be configured to perform plasma treatment using air as the process gas. The use of expensive special gases, for example argon, is not necessary.

The dielectric working chamber may be a disposable, replaceable article.

An inner diameter of the wall of the dielectric working chamber may be between 4 mm and 7 mm. Such inner diameters allow to receive common dental implants. The wall should not have an inner diameter larger than necessary to achieve the highest possible field strengths inside the tube. To activate the surface of the object to be activated, a field strength of at least 5 kV/mm should prevail inside the tube.

According to a further aspect, the present invention relates to a method of treatment of an object to be activated with a non-thermal atmospheric pressure plasma, comprising the following steps:

- Removing a dielectric working chamber from a sterile package, the dielectric working chamber comprising a wall of a dielectric material enclosing a working space, and wherein a metallization is applied to an outer side of the wall facing away from the working space,
- inserting the dielectric working chamber into an opening of a base unit, the base unit having a high-voltage source,
- introducing the object to be activated into the working space, and
- applying a high voltage to the object to be activated or to the metallization and thereby generating a dielectric plasma discharge between the object and the metallization. The process may take less than 90 seconds, preferably less than 60 seconds, in particular less than 30 seconds.

The working space may be an open volume. The object to be activated can be removed from a sterile envelope immediately before being inserted into the working space. The object to be activated can be gripped by a receptacle and inserted into the working space by means of the receptacle. The method according to the second aspect can be carried out with the device described above.

BRIEF DESCRIPTION OF THE DRAWINGS

In the following, the present invention will be explained with reference to the accompanying figures.

DETAILED DESCRIPTION OF THE DRAWINGS

Figure 1:
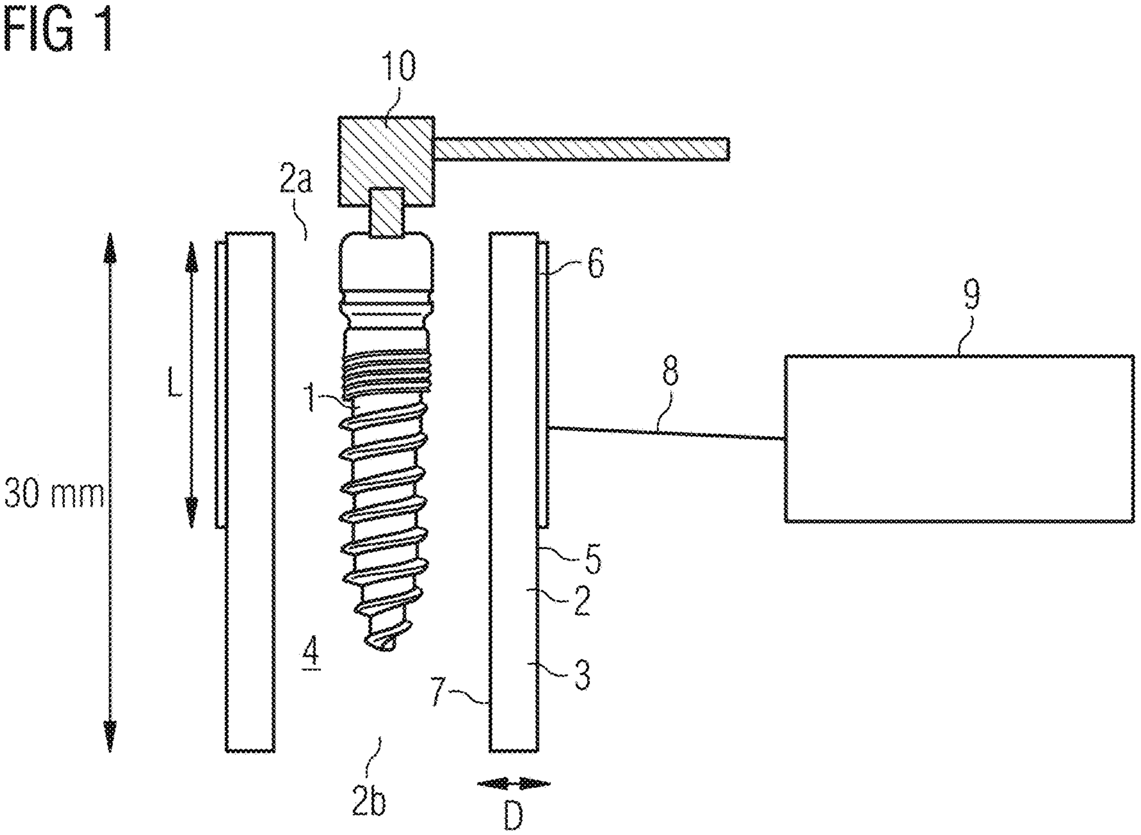
FIG. 1 schematically shows a device for generating a dielectric barrier discharge.

FIG. 1 schematically shows a device for generating a dielectric barrier discharge, which is configured to treat an object 1 to be activated with a non-thermal atmospheric pressure plasma. The object 1 to be activated is an implant configured to be inserted in a human or animal body. In particular, it is a dental implant. However, the device is also configured to treat other objects with the non-thermal atmospheric pressure plasma. For example, the object 1 to be activated may be made of titanium, in particular grade 4 titanium, or zirconium oxide. Both materials are common for implants. Alternatively or complementarily, the object 1 to be treated may comprise a metal, a plastic or a ceramic.

The treatment with non-thermal atmospheric pressure plasma hydrophilises the surface of the object 1. It is known that a healing time of an implant is substantially shortened and that its ingrowth behaviour (osseointegration) is substantially improved if the surface of the implant is hydrophilic. In addition, the healing process exhibits increased stability with hydrophilic objects.

Pure titanium surfaces are hydrophilic and can therefore be wetted very well with water or blood. However, organic impurities can make the surface hydrophobic. Such impurities can occur, for example, during the manufacture or storage of the implant. By treating the implant in the device shown in FIG. 1, it can be ensured that the surface is hydrophilic immediately before inserting the implant into a body. Good wettability of the implant with blood leads to a short healing time and stabilises the healing process.

The device has a dielectric working chamber 2. The dielectric working chamber 2 has a wall 3 made of a dielectric material which encloses a working space 4. The working space 4 is an open volume. In the embodiment example shown in FIG. 1, the wall 3 is sleeve-shaped. The dielectric working chamber 2 has an entrance 2*a*, through which the object 1 to be treated can be introduced into the working space 4, and an exit 2*b*. The exit 2*b* is opposite the entrance 2*a*. An air stream can flow through the working space 4 from the entrance 2*a* to the exit 2*b*.

The material of the wall 3 is chemically inert, so that chemical contamination of the object 1 to be activated is avoided during the plasma treatment. For example, the wall 3 may comprise a quartz, a glass or aluminium oxide.

A thickness D of the wall 3 is between 0.5 mm and 3.0 mm, preferably between 1.0 mm and 2.0 mm. For example, the thickness D of the wall may be 1.5 mm. Such thicknesses D of the wall 3 allow the wall 3 to act as a dielectric barrier during plasma discharge. The thickness D indicates the distance between an inner side 7 of the wall 3 and an outer side 5 of the wall 3.

The wall 3 encloses the working space 4. Atmospheric pressure may be present in the working space 4. It is not necessary in the device to lower the pressure in the working space 4 to a low pressure before the plasma treatment. However, in alternative embodiments of the device, the pressure in the working space 4 can be lowered so that a pressure of less than one atmosphere is present in the working space 4.

The working space 4 is filled with air. In an alternative embodiment example, the working space 4 is filled with another process gas.

An outer side 5 of the wall facing away from the working space 4 may be partially or completely coated with a metallization 6. The metallization 6 forms an electrode. The metallization 6 consists of an electrically conductive material, for example copper or silver. The metallization 6 can be sputtered on or electroplated. Further possibilities for applying the metallization 6 are the use of an adhesive foil, a metal hose pressed onto the tube or a conductive spray lacquer.

The metallization 6 completely surrounds the cylindrical wall 3 along the outer circumference of the wall 3. The length L of the metallization 6 indicates the extension of the metallization 6 in a longitudinal direction. The longitudinal direction runs along the axis of symmetry of the cylindrical wall 3 of the dielectric working chamber.

The length L of the metallization 6 should be adapted to the length of the object 1 to be treated. The length L of the metallization 6 can be between 10 mm and 30 mm. For example, a length of the metallization 6 of 20 mm can be chosen. Metallizations 6 with such lengths L are sufficient to completely enclose common dental implants and thus ensure that the entire implant is treated at the same time. The metallization 6 can also be longer, as plasma ignitions only occur between the electrode and the implant. Alternatively, the length L of the metallization 6 can also be chosen to be significantly smaller than the length of the object 1 to be treated. In this case, the object 1 to be treated must be moved in the longitudinal direction relative to the metallization 6 in such a way that it is ensured that the object 1 is completely treated with plasma.

In the embodiment example shown in FIG. 1, the metallization 6 is connected to a high-voltage source 9 via a contact 8. The high-voltage source 9 is configured to generate a high voltage and apply it to the metallization 6. For example, the high-voltage source 9 can be a piezoelectric transformer. A high voltage generated in the output area of the piezoelectric transformer is tapped off and applied to the metallization 6 via the contact 8. Alternative high-voltage sources 9 providing a high-voltage alternating voltage can also be used.

Furthermore, the device has a receptacle 10 which is configured to grip the object 1 to be treated and introduce it into the working space 4. The object 1 to be treated is connected to a reference potential, in particular a ground potential, via the receptacle 10. The receptacle 10 is configured to introduce the object 1 to be treated into the working space 4 in a linear movement. Furthermore, the receptacle 10 can be configured to move the object 1 to be treated in a linear movement within the working space 4. For example, this may be an up and down movement. Furthermore, the receptacle 10 is configured to rotate the object 1 to be treated in a rotational movement within the working space 4. The linear and rotational movement of the object 1 to be treated within the working space 4 can ensure that the surface of the object 1 to be treated is evenly treated with the plasma.

The object 1 to be treated, to which a reference potential is applied via the receptacle 10, acts as a counter-electrode during the plasma discharge, the electrode being formed by the metallization 6 of the wall 3. The wall 3 acts as a dielectric barrier between the metallization 6 and the object 1 to be treated. Plasma ignition thus occurs by dielectric barrier discharge, in which the plasma is generated directly on the surface of the object 1 to be treated.

The receptacle 10 can be a tool which is either moved by hand or which is connected to a mechanical drive. It can also be, for example, a torque ratchet or a spanner.

Figure 2:
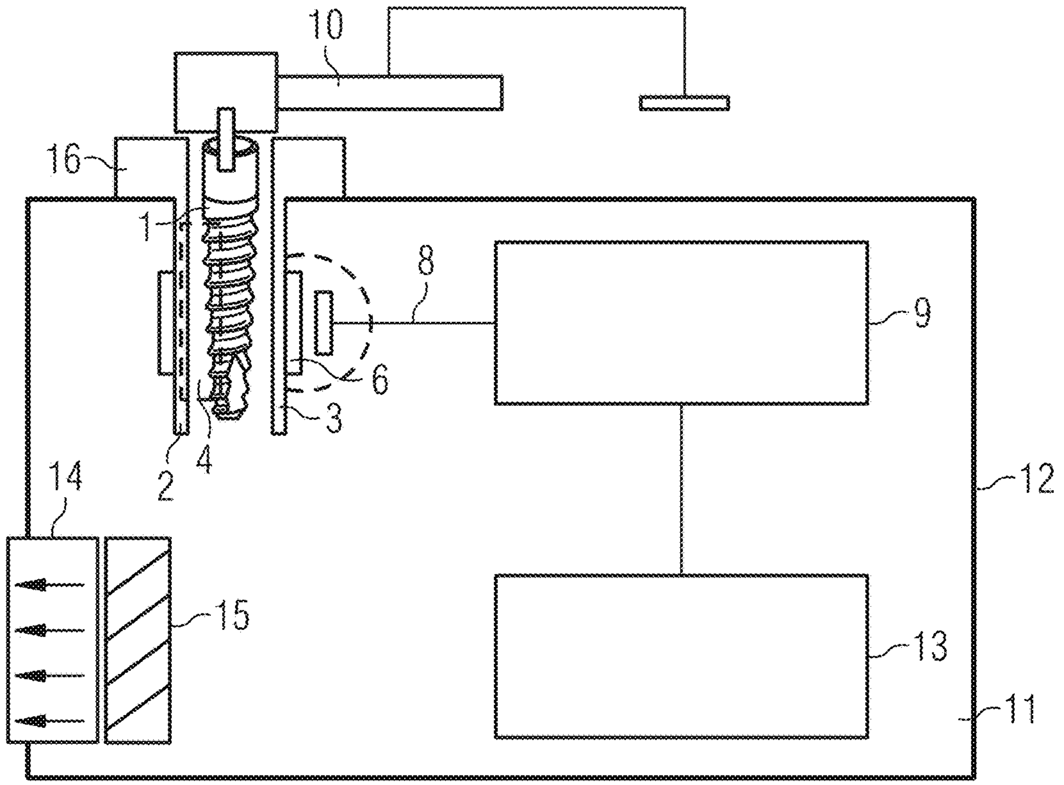
FIG. 2 shows the device shown in FIG. 1 in greater detail.

FIG. 2 shows the device shown in FIG. 1 in greater detail. The device further comprises a base unit 11 with a housing 12 in which the dielectric working chamber 2 is inserted. The dielectric working chamber 2 is designed as a sterile exchange unit. It is inserted into the housing 12 immediately before the plasma treatment. The base unit 11 has an opening into which the dielectric working chamber 2 is inserted.

The base unit 11 contains the high-voltage source 9 and possibly other elements. A control unit 13 for controlling the high-voltage source 9 is arranged in the base unit 11. The control unit 13 has interfaces for interaction with a user. For example, the control unit 13 has a display and function keys. Further, the base unit 11 may comprise a fan 14. The fan 14 can provide a constant flow of air through the working chamber 2. This can ensure that the object 1 to be treated is cooled by the air flow and is not heated too much during the plasma treatment. Furthermore, the base unit 11 may comprise a filter 15 arranged between the dielectric working chamber 2 and an air outlet of the fan 14. The filter 15 may in particular be configured to filter out ozone. Ozone is produced as a by-product during plasma treatment and can be harmful to health if the concentration is too high. The addition of the ozone filter 15 can ensure that excessive ozone concentrations cannot occur outside the housing 12.

The base unit 11 permanently houses the components of the device that do not need to be replaced after each plasma treatment of an object 1 to be activated. These include the high-voltage source 9, the control unit 13, the fan 14 and the filter 15.

Immediately before the plasma treatment, the dielectric working chamber 2 is inserted into the base unit 11. When the dielectric working chamber 2 is inserted into the opening of the base unit 11, the dielectric working chamber 2 is arranged in such a way that the metallization 6 is electrically contacted with the high voltage supply 9, so that the high voltage supply 9 applies a high voltage to the metallization 6. When the dielectric working chamber 2 is inserted into the base unit 11, the metallization 6 is connected to the contact 8.

Subsequently, the object 1 to be treated can be introduced into the working space 4 by means of the receptacle 10. For this purpose, the object 1 to be treated is gripped by the receptacle 10 and inserted through the entrance 2*a* of the dielectric working chamber 2. Now the plasma treatment begins, whereby the object 1 to be treated is moved during the plasma treatment by means of the receptacle 10. The plasma treatment lasts less than 90 seconds, preferably less than 60 seconds, in particular less than 30 seconds.

After the plasma treatment, first the object 1 to be activated and then the dielectric working chamber 2 are removed from the base unit 11. After the end of the plasma treatment, the object 1 to be activated can be removed from the dielectric working chamber 2 and, for example, the medical treatment can be started immediately with the step of inserting the implant. Intermediate storage of the object 1 to be treated is not necessary. Due to the short duration of the plasma treatment, the plasma treatment can be carried out immediately before the medical treatment of inserting the implant.

The wall of the dielectric working chamber 2 has a part 16 in the part of the entrance 2*a*, the thickness of which is higher than the thickness of the wall 3 in the remaining part of the dielectric working chamber 2. Due to the increased thickness, the part 16 forms a collar of the dielectric working chamber 2. The part 16 forms a support which rests on the housing 12 when the dielectric working chamber 2 is arranged in the opening of the base unit 11. In this way, the dielectric working chamber 2 can be stably positioned on the base unit 11. This ensures that the dielectric working chamber 2 is arranged in a defined position. Furthermore, the part 16 of the increased thickness serves as a support for the receptacle 10 when an object 1 to be activated is inserted from the receptacle 10 into the dielectric chamber 2. Thus, the object 1 to be activated is arranged in a defined position within the working space 4. The part 16 of increased thickness also provides insulation between the metallization 6 and the receptacle 10. Furthermore, the part 16 of increased thickness provides a seal to the housing 12 so that little ozone escapes from the opening of the housing 12 into which the electrical working chamber 2 is inserted.

Figure 3:
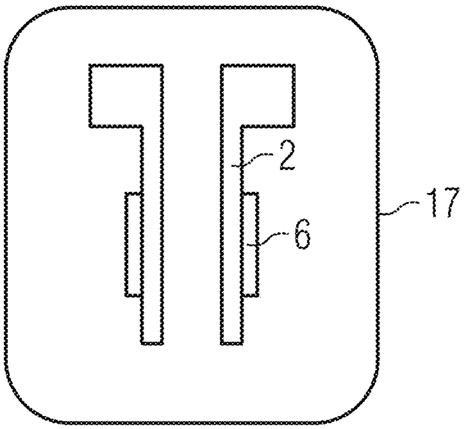
FIG. 3 shows a dielectric working chamber in a sterile package.

FIG. 3 shows the dielectric working chamber 2 in a sterile package 17. The dielectric working chamber 2 is only used once during the plasma treatment and is to be disposed of after the plasma treatment has been carried out. Before the next plasma treatment, a new dielectric working chamber 2 is to be inserted into the base unit 11. In this way it is possible to avoid cleaning the high voltage source 9, which would be very complex. Immediately before insertion into the base unit 11, the dielectric working chamber 2 is removed from the sterile packaging 17. This ensures that the dielectric working chamber 2 is not contaminated.

Figure 4:
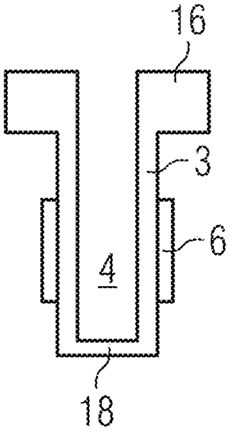
FIG. 4 shows an alternative embodiment of a dielectric working chamber.

FIG. 4 shows an alternative embodiment of the dielectric working chamber 2. In the alternative embodiment shown in FIG. 4, the wall 3 additionally has a bottom 18 which closes the exit of the working chamber. This dielectric working chamber can also be inserted into the housing.

Figure 5:
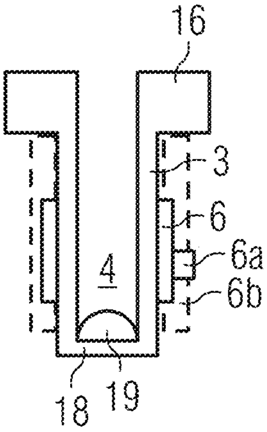
FIG. 5 shows another alternative embodiment of a dielectric working chamber.

FIG. 5 shows another alternative embodiment of the dielectric working chamber 2. In the embodiment shown in FIG. 5, an active substance 19 is additionally arranged on the bottom of the working chamber 2. The active substance 19 can be a process gas or a liquid. If the active substance 19 is supplied at a given vapour pressure during a dielectric barrier discharge, new species can be formed in the gas phase which have a strongly oxidising character or which have a reducing character, or chemically reactive fragments can be released, whereby rough glass-like layers can be formed on the object to be activated. For example, the active substance 19 may comprise water or hydrogen peroxide, which may cause oxidation during the dielectric barrier discharge. Alternatively or additionally, the active substance 19 may comprise hydrogen, which has a reducing effect during the dielectric barrier discharge. Alternatively or additionally, the active substance 19 may be HMDSO or TEOS organosilicon compound applied by PECVD (plasma enhanced chemical vapor deposition), which release chemically reactive fragments.

The metallization 6 has an outwardly projecting protrusion 6*a* which allows the metallization 6 to be contacted. Further, the metallization 6 is covered by an insulation 6*b*, wherein the protrusion 6*a* protrudes from the insulation 6*b* and thus remains free of the insulation 6*b*. The insulation 6*b* protects the metallization 6. The protrusion 6*a* enables contacting of the metallization 6 despite the insulation 6*b*. The working chambers 2 shown in the previous figures may also have a metallization 6 with the protrusion 6*a* projecting outwards and the insulation 6*b*.

Figure 6:
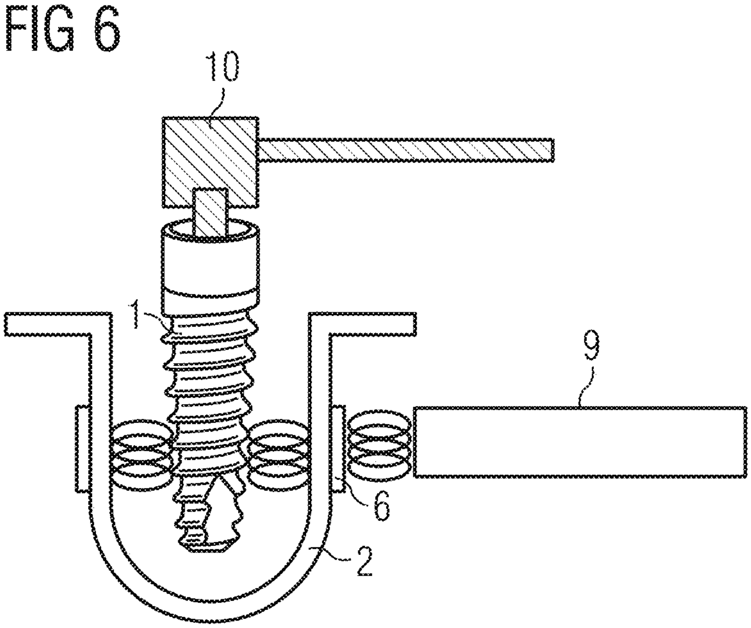
FIG. 6 shows an alternative embodiment of the device for generating a dielectric barrier discharge.

FIG. 6 shows an alternative embodiment of the device. In the embodiment example shown in FIG. 6, the high voltage source 9, in this case a piezoelectric transformer, is not directly connected to the metallization 6 on the dielectric working chamber 2 via a line or contact 8. Instead, the energy transfer between the high-voltage source 9 and the metallization 6 takes place without contact, e.g. via a discharge or a spark gap.

Figure 7:
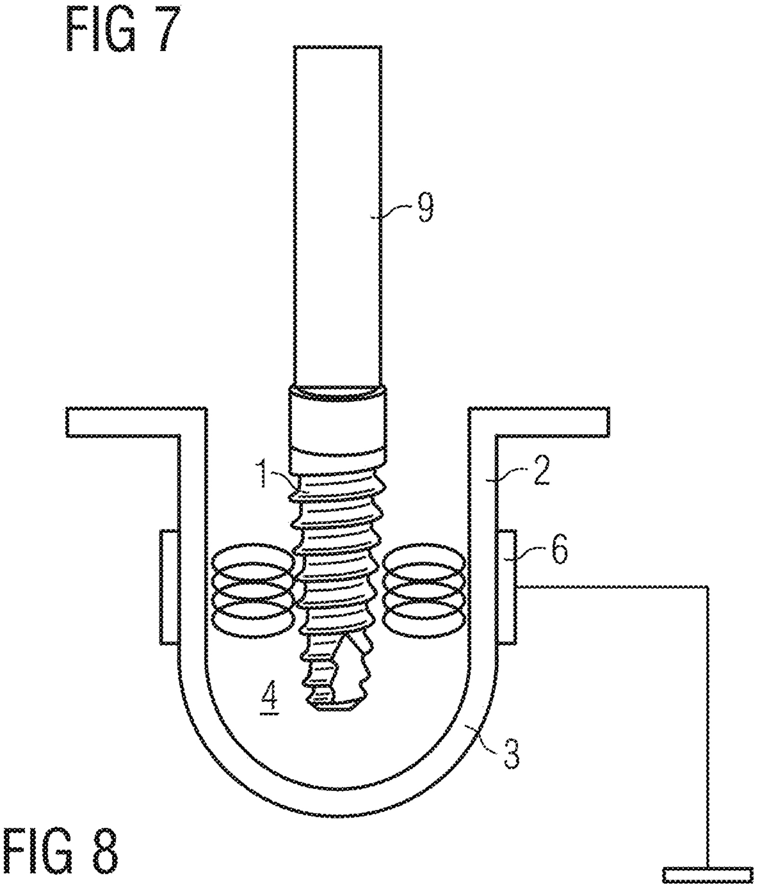
FIG. 7 shows another alternative embodiment of the device for generating a dielectric barrier discharge.

FIG. 7 shows another alternative embodiment. In the example shown in FIG. 7, the high-voltage source 9 is not connected to the metallization 6 on the dielectric working chamber 2, but to the object 1 to be treated. Accordingly, a high voltage is applied to the object 1 to be treated. The metallization 6 on the dielectric working chamber 2 is connected to the reference potential. Just as in the previous embodiments, a dielectric discharge and plasma ignition occur due to the potential difference between the surface of the object 1 to be treated and the metallization 6. The wall 3 of the dielectric working chamber 2 also acts here as a dielectric barrier.

Figure 8:
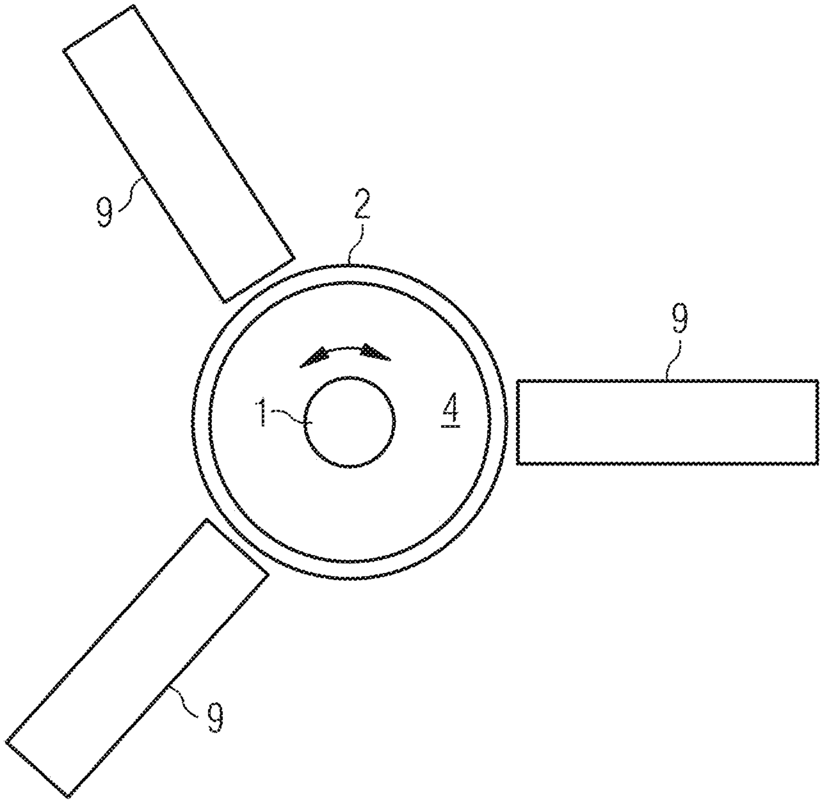
FIG. 8 shows yet another alternative embodiment of the device for generating a dielectric barrier discharge.

FIG. 8 shows a further example of an embodiment. In the example shown in FIG. 8, several, for example three, piezoelectric transformers are arranged around the dielectric working chamber 2 as high-voltage sources 9. The piezoelectric transformers are operated openly, i.e. the energy is transferred via a spark gap or a discharge, as also shown in FIG. 5. By using several high-voltage sources 9, the energy loss that inevitably occurs with contactless energy transmission can be compensated. The object 1 to be activated is rotated in the working space 4 during the plasma treatment.

Figure 9:
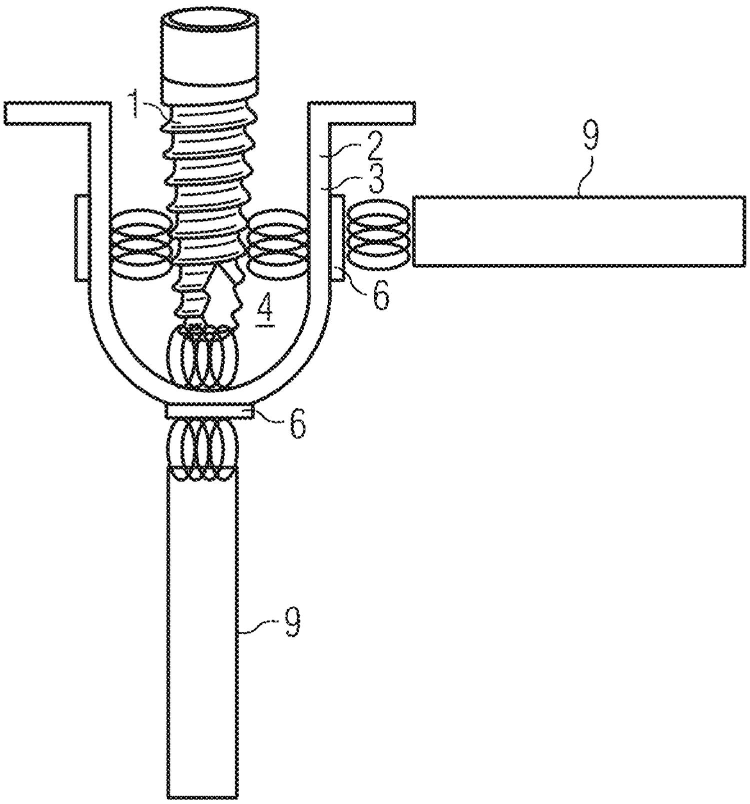
FIG. 9 shows a further alternative embodiment of the device for generating a dielectric barrier discharge.

FIG. 9 shows another alternative embodiment in which a first high-voltage source 9, which is a piezoelectric transformer, is arranged on one longitudinal side of the working chamber 2 and transmits energy to the metallization 6 without contact. Furthermore, a second high-voltage source, in particular a second piezoelectric transformer, is arranged under the bottom 18 of the dielectric working chamber 2. A metallization 6 is applied to the outer side of the bottom 18, which faces away from the working space 4, and the piezoelectric transformer transmits a high voltage 9 to this. This results in a plasma ignition between the bottom 18 and the object 1 to be activated. The energy transmission between the second high-voltage source 9 and the metallization 6 of the bottom 18 takes place without contact, i.e. via a discharge or a spark gap. Alternatively, the second high-voltage source 9 could be electrically connected to the metallization 6 via a contact 8.

Figure 10:
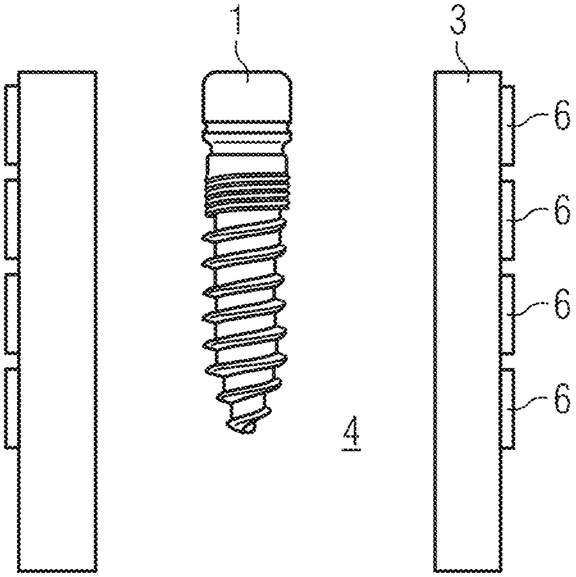
FIG. 10 shows a further alternative embodiment of a dielectric working chamber.

FIG. 10 shows a further embodiment of the dielectric working chamber 2. In the embodiment shown in FIG. 10, the metallization 6 is not continuous, but consists of several ring-shaped metallizations 6 separated from each other. Each ring of the metallizations 6 can, for example, have a length in a range of 1 mm to 3 mm, whereby between two rings in each case an area with an extension in the longitudinal direction of between 0.5 mm and 2.0 mm is arranged free of a metallization 6.

The ring-shaped design of the metallization 6 leads to a reduction of the capacitance, whereby a parasitic load decreases. As a result, the power consumption of the device is reduced and less reactive currents flow. Furthermore, the field strength at the edges of the rings is particularly high, which enables a particularly efficient plasma treatment. Alternatively, only a single ring could be used as metallization 6 and the object 1 to be treated could be moved sufficiently in the longitudinal direction to ensure that it is treated over its entire surface.

LIST OF REFERENCE SIGNS 1 object to be activated/implant
2 Dielectric working chamber
2*a* entrance
2*b* Exit
3 wall
4 working space
5 outer side
6 Metallization
6*a* Protrusion
6*b* Insulation
7 Inner side
8 Contact
9 High voltage source
10 Receptacle
11 Base unit

12 Housing
13 Control unit
14 Fan
15 Filter
16 Part/collar
17 Packing
18 Bottom
19 Active substance
D Thickness of wall
L Length of metallization

The invention claimed is:

1. A device for generating a dielectric barrier discharge for a treatment of an object to be activated with non-thermal atmospheric pressure plasma, comprising:

a dielectric working chamber having a wall made of a dielectric material and enclosing a working space, the wall having an outer side facing away from the working space, the outer side having metallization that is a metal layer applied to the wall in a material-bonding manner, the working space being an open volume; and a high-voltage source which is configured to apply a high voltage to the metallization or to the object to be activated when the object to be activated is arranged in the working space.

2. The device according to claim 1, further including a receptacle that is configured to receive the object to be activated and to move the object into the working space.

3. The device according to claim 2, wherein the receptacle is configured to move the object to be activated in the working space in a rotational movement and/or in a translational movement.

4. The device according to claim 1, wherein the object to be activated is an implant treated with non-thermal atmospheric pressure plasma prior to a medical treatment.

5. The device according to claim 1, wherein the high voltage source is configured to generate the dielectric barrier discharge between the object to be activated and the metallization.

6. The device according to claim 1, wherein atmospheric pressure is present in the working space, or wherein a pressure lower than 1 Atm is present in the working space.

7. The device according to claim 1, wherein the device is configured to hydrophilize a surface of the object to be activated by the treatment with non-thermal atmospheric pressure plasma.

8. The device according to claim 1, further comprising a base unit having an opening for receiving the dielectric working chamber.

9. The device according to claim 8, wherein the dielectric working chamber is adapted to be inserted into the opening of the base unit before the treatment and to be removed from the opening of the base unit after the treatment has been performed.

10. The device according to claim 8, wherein the high voltage source is arranged in the base unit.

11. The device according to claim 1, wherein the wall of the dielectric working chamber has a part located at an entrance of the dielectric working chamber and having a larger thickness than other parts of the wall.

12. The device according to claim 1, wherein the metallization is a continuous sleeve-shaped metallization or comprises several annular sections separated from each other.

13. The device according to claim 1, wherein the high voltage source comprises a piezoelectric transformer.

14. The device according to claim 1, further comprising a fan and/or a filter.

15. The device according to claim 1, wherein the working space is filled with air.

16. The device according to claim 1, wherein the dielectric working chamber is a replaceable disposable article.

17. The device according to claim 1, wherein an inner diameter of the wall of the dielectric working chamber is in a range of 4 mm to 7 mm.

18. The device according to claim 1, further comprising a plurality of high voltage sources.

19. A method of treating an object to be activated with a non-thermal atmospheric pressure plasma, comprising:

removing a dielectric working chamber from a sterile package, the dielectric working chamber having a wall made of a dielectric material that encloses a working space, the wall having an outer side facing away from the working space, the outer side having metallization that is a metal layer applied to the wall in a material-bonding manner;

inserting the dielectric working chamber into an opening of a base unit, the base unit having a high-voltage source;

introducing the object to be activated into the working space; and applying a high voltage to the object to be activated or to the metallization so as to generate a dielectric plasma discharge between the object and the metallization.

20. The method according to claim 19, wherein the method takes less than 90 seconds.

21. A device for generating a dielectric barrier discharge for the treatment of an object to be activated with non-thermal atmospheric pressure plasma, comprising:

a dielectric working chamber having a wall made of a dielectric material and enclosing a working space, the wall having an outer side facing away from the working space, the outer side having metallization that is a metal layer applied to the wall in a material-bonding manner, the working space being an open volume; and a high-voltage source which is configured to apply a high voltage to the metallization or to the object to be activated when the object to be activated is arranged in the working space, wherein the open volume is a non-closed volume such that ambient air from around the device is permitted to enter the open volume.

22. A device for generating a dielectric barrier discharge for the treatment of an object to be activated with non-thermal atmospheric pressure plasma, comprising:

a dielectric working chamber having a wall made of a dielectric material and enclosing a working space, the wall having an outer side facing away from the working space, the outer side having metallization that is a metal layer applied to the wall in a material-bonding manner, the working space being an open volume;

a high-voltage source which is configured to apply a high voltage to the metallization or to the object to be activated when the object to be activated is arranged in the working space; and a receptacle that is configured to receive the object to be activated, to move the object into the working space and to move the object to be activated during the plasma treatment inside the working space.

23. A device for generating a dielectric barrier discharge for the treatment of an object to be activated with non-thermal atmospheric pressure plasma, comprising:

a dielectric working chamber having a wall made of a dielectric material and enclosing a working space, the wall having an outer side facing away from the working space, the outer side having metallization that is a metal layer applied to the wall in a material-bonding manner, the working space being an open volume; and a high-voltage source that is directly connected to the object and applies a high voltage to the object when the object to be activated is arranged in the working space.

24. A device for generating a dielectric barrier discharge for the treatment of an object to be activated with non-thermal atmospheric pressure plasma, comprising:

a dielectric working chamber having a wall made of a dielectric material and enclosing a working space, the wall having an outer side facing away from the working space, the outer side having metallization that is a metal layer applied to the wall in a material-bonding manner, the working space being an open volume; and a high-voltage source which is configured to apply a high voltage to the metallization or to the object to be activated when the object to be activated is arranged in the working space, wherein the dielectric working chamber comprises a bottom wall portion closing an exit of the dielectric working chamber, wherein an active substance is arranged on the bottom wall portion of the dielectric working chamber.

* * * * *